United States Patent [19]

Chen et al.

[11] 4,196,963
[45] Apr. 8, 1980

[54] METHOD FOR ELIMINATING LI$_2$O OUT-DIFFUSION IN LINBO$_3$ AND LITAO$_3$ WAVEGUIDE STRUCTURES

[75] Inventors: Bor-Uei Chen, Northridge; Antonio C. Pastor, Santa Monica; Gregory L. Tangonan, Oxnard, all of Calif.

[73] Assignee: Hughes Aircraft Company, Culver City, Calif.

[21] Appl. No.: 910,407

[22] Filed: May 30, 1978

[51] Int. Cl.$^2$ .................. C03C 21/00; G02B 5/14
[52] U.S. Cl. ................. 350/96.12; 65/30 R; 65/30 E; 65/117
[58] Field of Search .............. 65/30 R, 32, 30 E, 117; 106/73.31, 39.5; 350/96.12

[56] References Cited

U.S. PATENT DOCUMENTS

| | | | |
|---|---|---|---|
| 3,837,827 | 9/1974 | Carruthers et al. | 65/32 X |
| 3,868,170 | 2/1975 | DeLuca | 65/30 R X |
| 3,885,941 | 5/1975 | Maher | 65/18 |
| 4,017,291 | 4/1977 | Gliemeroth et al. | 65/30 R |
| 4,066,426 | 1/1978 | Maher | 65/32 X |
| 4,146,379 | 3/1979 | Copley et al. | 65/32 X |

OTHER PUBLICATIONS

T. R. Ranganath and S. Wang, "Suppression of Li$_2$O Out-diffusion from Ti-diffused LiNbO$_3$ Optical Waveguides", Applied Physics Letters, vol. 30, No. 8, Apr. 15, 1977, pp. 376–379.
S. Miyazawa, R. Guglielmi, and A. Carenco, "A Simple Technique for Suppressing Li$_2$O Out-diffusion in Ti:-LiNbO$_3$ Optical Waveguide", No. 11, Déc. 1, 1977, pp. 742–744.
R. L. Holman, P. J. Cressman, and J. F. Revelli, "Chemical Control of Optical Damage in Lithium Niobate", Applied Physics Letters, 32(5), Mar. 1, 1978, pp. 280–283.
Bor-Uei Chen and Antonio C. Pastor, Elimination of Li$_2$O Out-Diffusion Waveguide in LiNbO$_3$ and LiTaO$_3$", Applied Physics Letters, vol. 30, No. 11, Jun. 1, 1977, pp. 570–571.

*Primary Examiner*—Richard V. Fisher
*Attorney, Agent, or Firm*—Mary E. Lachman; W. J. Bethurum; W. H. MacAllister

[57] ABSTRACT

A process for suppressing the out-diffusion of Li$_2$O from LiNbO$_3$ and LiTaO$_3$ waveguide structures by exposing the structures to a Li$_2$O-rich environment at sufficient vapor pressure that Li$_2$O diffuses into the structure as a compensation process and a solid-solid surface interaction occurs. In one embodiment of the invention, the out-diffusion of Li$_2$O from LiNbO$_3$ and LiTaO$_3$ crystals into which Ti has been diffused is eliminated by annealing the structure in a high purity powder of LiNbO$_3$ or LiTaO$_3$. In a second embodiment, the Li$_2$O out-diffusion is partially suppressed by annealing the structure in molten LiNO$_3$. In a third embodiment of the invention, a waveguide structure comprising a Li$_2$O-rich guiding layer is formed by annealing LiNbO$_3$ or LiTaO$_3$ crystals in a high purity powder of LiNbO$_3$ or LiTaO$_3$, which not only suppresses Li$_2$O out-diffusion but also promotes Li$_2$O in-diffusion into the crystals.

11 Claims, 4 Drawing Figures

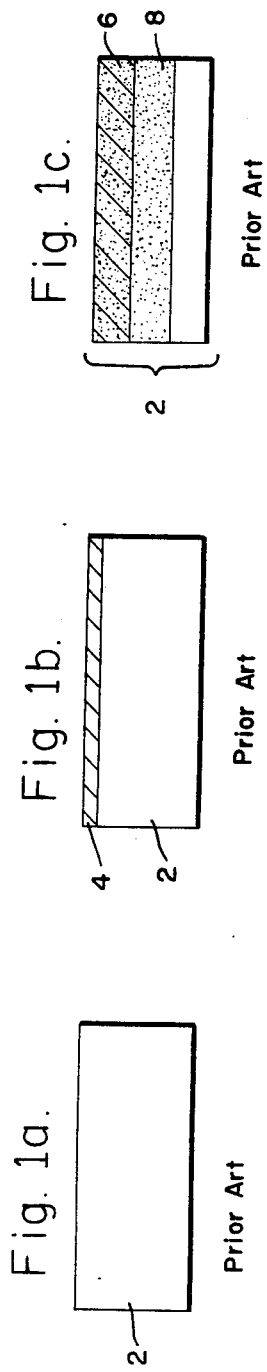
Fig. 1a. Prior Art
Fig. 1b. Prior Art
Fig. 1c. Prior Art
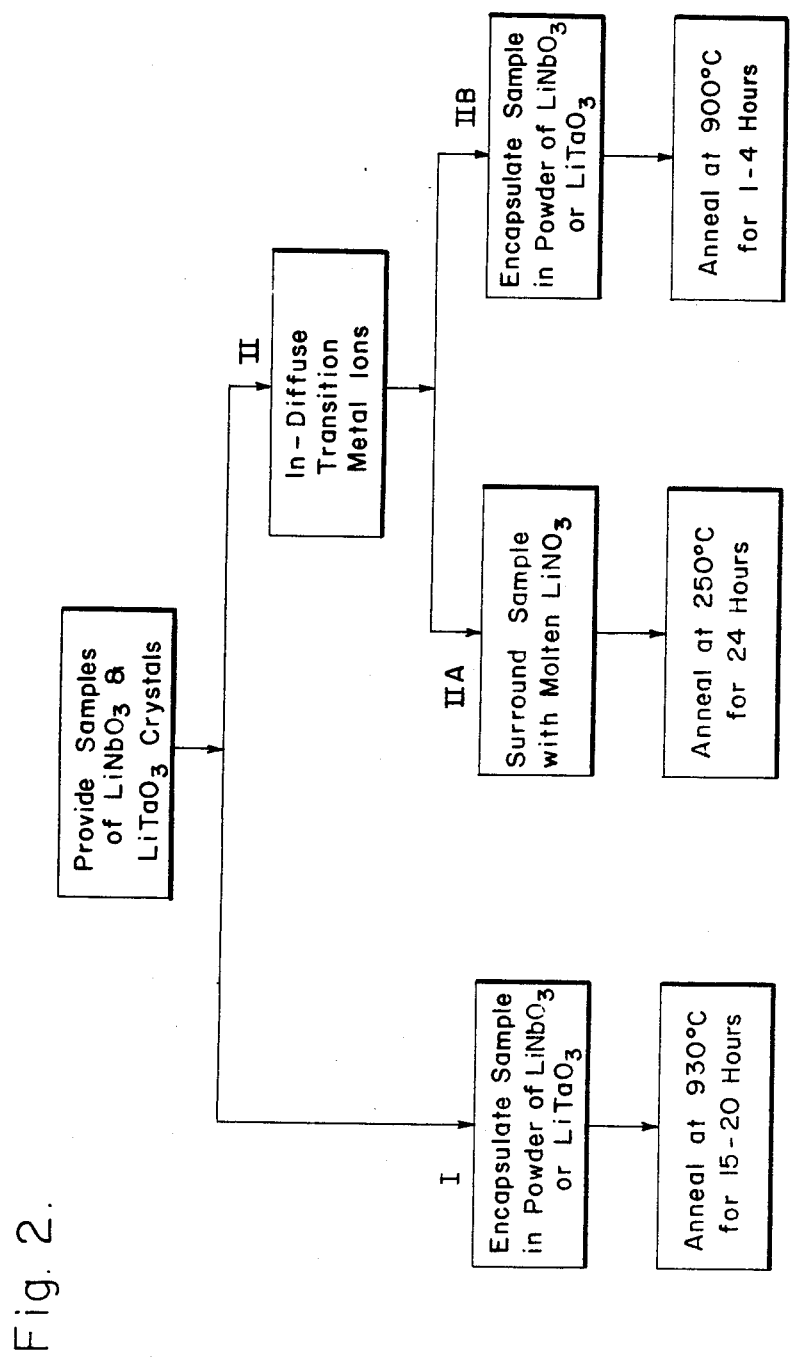
Fig. 2.

METHOD FOR ELIMINATING Li₂O OUT-DIFFUSION IN LINBO₃ AND LITAO₃ WAVEGUIDE STRUCTURES

FIELD OF THE INVENTION

This invention relates generally to processes for forming and treating electro-optical materials and more particularly to a process for preventing undesirable waveguide modes in lithium niobate and lithium tantalate crystal substrates.

BACKGROUND OF THE INVENTION

In optical communication systems, messages are transmitted by carrier waves of optical frequencies that are generated by sources such as lasers or light-emitting diodes. There is much current interest in such optical communication systems because they offer several advantages over conventional communication systems, such as a greatly increased number of channels of communication and the ability to use other materials besides expensive copper cables for transmitting messages. One such means for conducting or guiding waves of optical frequencies from one point to another is called an "optical waveguide." The operation of an optical waveguide is based on the fact that when a medium which is transparent to light is surrounded or otherwise bounded by another medium having a lower refractive index, light introduced along the inner medium's axis is totally reflected at the boundary with the surrounding medium, thus producing a guiding effect.

Certain electro-optical materials are very attractive for this application since they make it possible to achieve electrical control and high-speed operation in light propagating structures. The use of lithium niobate ($LiNbO_3$) and lithium tantalate ($LiTaO_3$) crystals for such purposes is well-known in the art and is disclosed, for example, in an article entitled "Integrated Optics and New Wave Phenomenon in Optical Waveguides," P. K. Tien, in *Reviews of Modern Physics*, Vol. 49, No. 2, (1977) pp. 361–420. These latter materials have large electro-optic and acousto-optic coefficients which are desirable to provide control of light propagation in the optical waveguide. Many different types of active channel waveguide devices using these materials have been used in a variety of modulators and switches which are compatible with single-mode optical fibers.

Various methods of forming high refractive index waveguides in $LiNbO_3$ and $LiTaO_3$ have been used in the art. They include: epitaxial growth by sputtering, epitaxial growth by melting, lithium oxide ($Li_2O$) out-diffusion, and transition metal in-diffusion. Epitaxial growth by sputtering often leads to films with high losses and poor electro-optical properties. In epitaxial growth by melting, the film thickness cannot be easily controlled. The $Li_2O$ out-diffusion process generates a film which can support only TE polarization waves (polarization parallel to the surface of the waveguide structure) propagating along the X or Y axes.

The in-diffusion of a transition metal, such as titanium, nickel, or vanadium, into $LiNbO_3$ or $LiTaO_3$ offers a promising technique to produce planar as well as channel waveguide structures. However, a serious problem arises with this latter approach because at the high temperature required for metal in-diffusion, loosely bound $Li_2O$ diffuses out from the surface of the crystal structure. As a result of this $Li_2O$ out-diffusion, a $Li_2O$-deficient planar waveguide layer is formed in both the $LiNbO_3$ and the $LiTaO_3$ crystals in addition to the waveguides formed by metal in-diffusion. The out-diffusion waveguide can confine TE polarization waves propagating along the X-axis on a Y-cut wafer (or the Y-axis on an X-cut wafer) in an undesirable manner. (A Y-cut wafer is a wafer cut perpendicular to the Y-axis of the crystal. For a more detailed description of crystal cutting, refer to "Standards on Piezoelectric Crystals, 1949," *Proceedings of the Institute of Radio Engineers*, pages 1378–1395, Dec. 1949.) In a channel waveguide device, a planar out-diffusion waveguide introduces excessive cross-talk between guided modes from two adjacent waveguides. Cross-talk presents particular difficulties when trying to achieve compatibility between a fiber optic communications link and optical channel waveguide switches/modulators. The planar index increase in the C-axis caused by the out-diffusion of $Li_2O$ limits the implementation of the optical switches to TM modes only (i.e., polarization perpendicular to the surface of the waveguide structure). In addition, in an end-butt coupling configuration between a single-mode optical fiber and a channel waveguide, a large portion of the optical energy goes to the unwanted out-diffusion modes, which are readily excited by the optical fiber input, and thus the coupling to the channel waveguide is effectively diminished. It is the alleviation of these various problems caused by $Li_2O$ out-diffusion to which the present invention is directed.

The cause of the out-diffusion of $Li_2O$ from $LiNbO_3$ and $LiTaO_3$ crystals is inherent in the particular structure of these crystals. It is well known that $LiNbO_3$ and $LiTaO_3$ crystals can be grown in a slightly non-stoichiometric form, $(Li_2O)_\nu(M_2O_5)_{1-\nu}$ where M may be Nb or Ta and $\nu$ ranges from 0.48 to 0.50. At the high temperature (850° C. to 1200° C.) required for the in-diffusion of transition metal ions in order to form a waveguide in $LiNbO_3$ and $LiTaO_3$ crystals, the loosely bound $Li_2O$ diffuses out from the surface of the crystal. It is known experimentally that for a small change of $\nu$ in $LiNbO_3$ and $LiTaO_3$, the ordinary refractive index remains unchanged while the extraordinary refractive index (along the C-axis) increases approximately linearly as $\nu$ decreases. The reduction in the $Li_2O$ concentration at the surface of the crystal due to out-diffusion thus forms a high-index layer which traps optical beams in the resulting waveguide structure.

It has been reported by W. Phillips and J. M. Hammer in the *Journal of Electronic Materials*, Vol. 4, p. 549, 1975 that Li enrichment at the surface can be achieved by annealing the substrates in $Li_2CO_3$ at 550°–600° C. for a period of about 60 hours. In experiments where diffused lithium-niobate-tantalate waveguides were formed, all the $LiTaO_3$ wafers were treated with this Phillips et al process before polishing. After the annealing treatment, the substrates became dark brown, were found hard to polish, and were more susceptible to cracking. The brownish color can be bleached out during the high-temperature metal diffusion. Although a reduction in waveguide loss was noted, this $Li_2CO_3$ powder treatment failed to prevent the formation of out-diffusion waveguides. We have also tried the $Li_2CO_3$ annealing of Ti-diffused waveguides after diffusion, but after 120 hours of annealing at 600° C. in a flowing oxygen atmosphere, the $Li_2O$ out-diffusion waveguides persisted. The present invention seeks to overcome the disadvantages of the prior art processes for eliminating Li$_2$O out-diffusion and to more effectively accomplish the suppression of Li$_2$O out-diffusion.

SUMMARY OF THE INVENTION

The general purpose of this invention is to provide a novel means to suppress the out-diffusion of Li$_2$O from LiNbO$_3$ and LiTaO$_3$ waveguide structures and to eliminate the consequent, undesirable waveguide modes produced thereby.

In order to accomplish this purpose, we have discovered and developed, among other things, novel processes and devices in which the out-diffusion of Li$_2$O from LiNbO$_3$ and LiTaO$_3$ waveguides is suppressed by exposing a sample of either LiNbO$_3$ or LiTaO$_3$ to either LiNbO$_3$, LiTaO$_3$ or LiNO$_3$ in chosen forms and then annealing the sample for a period of time and at a temperature sufficient to produce a uniform Li$_2$O vapor pressure and a Li$_2$O-rich environment at the surface of the sample. More specifically, the present invention provides, in one embodiment thereof, a process for forming a thin-film waveguide in LiNbO$_3$ and LiTaO$_3$ crystals, comprising a Li$_2$O-rich guiding layer, in which both TE and TM polarizations are optimized by suppression of Li$_2$O out-diffusion and promotion of Li$_2$O in-diffusion. This process includes annealing the sample of LiNbO$_3$ or LiTaO$_3$ in a high purity powder of LiNbO$_3$ or LiTaO$_3$. The present invention further provides, in two embodiments thereof, two separate processes respectively by which the out-diffusion of Li$_2$O from LiNbO$_3$ and LiTaO$_3$ waveguides is suppressed. In one embodiment, the sample of LiNbO$_3$ or LiTaO$_3$ is annealed in molten LiNO$_3$ and Li$_2$O out-diffusion is suppressed, while in another process embodiment, the sample is annealed in a high purity powder of LiNbO$_3$ or LiTaO$_3$ and Li$_2$O out-diffusion is eliminated.

The present invention is based on the discovery that Li$_2$O can be satisfactorily diffused into LiNbO$_3$ and LiTaO$_3$ crystals for optical fabrication purposes, which is believed to be a hitherto unknown fact. The mechanism of this Li$_2$O compensation process is believed to be as follows. At high temperatures, the loosely bound Li$_2$O molecules tend to escape from the surface of the LiNbO$_3$ or LiTaO$_3$ crystal structure, as previously discussed. In accordance with the present invention, the wafer is exposed to a Li$_2$O-rich environment such that out-diffusion of Li$_2$O from the wafer is suppressed and the compensation process of diffusing Li$_2$O back into the wafer becomes thermodynamically favorable. In addition, under these conditions, favorable solid-solid surface reactions occur. The source of the Li$_2$O-rich environment is a high purity powder of LiNbO$_3$ or LiTaO$_3$ for two embodiments of the invention and is molten LiNO$_3$ for a third embodiment of the invention.

The suppression of the Li$_2$O out-diffusion from LiNbO$_3$ and LiTaO$_3$ waveguide structures in accordance with the present invention prevents the formation of unwanted waveguide modes and the associated problem of excessive cross-talk between guided modes. Thus, it facilitates waveguide switching and modulation. Further, our invention enables efficient end-butt coupling between a single mode optical fiber and a channel waveguide to be achieved.

Accordingly, it is an object of the present invention to provide new and improved processes for suppressing the out-diffusion of Li$_2$O from LiNbO$_3$ and LiTaO$_3$ waveguide structures.

It is a further object to provide processes for eliminating undesirable out-diffusion waveguide modes in LiNbO$_3$ and LiTaO$_3$ waveguide structures.

Another object of the invention is to provide a process for forming thin-film waveguides in LiNbO$_3$ and LiTaO$_3$ crystals.

A further object is to provide thin-film waveguides in LiNbO$_3$ and LiTaO$_3$ crystals in which both TE and TM polarizations are optimized for C-axis propagation.

Still another object is to provide LiNbO$_3$ and LiTaO$_3$ waveguide structures in which undesirable out-diffusion waveguide modes have been eliminated.

These and other objects of the invention will become more readily apparent in the following description of the accompanying drawings and of the examples.

BRIEF DESCRIPTION OF THE DRAWINGS

FIG. 1 illustrates in schematic cross-section the formation of a prior art waveguide structure in which Li$_2$O out-diffusion has occurred.

FIG. 2 presents a flowchart illustrating some of the major steps in the process sequence for three embodiments of the invention.

DETAILED DESCRIPTION OF THE DRAWINGS

FIG. 1 illustrates the formation of a prior art waveguide structure. In FIG. 1a there is shown a wafer 2 of LiNbO$_3$ or LiTaO$_3$ which is the substrate starting material. A thin layer 4 of titanium (Ti) metal is deposited on the surface of substrate 2 as shown in FIG. 1b, using well-known electron beam evaporation procedures, as discussed by K. L. Chopra, "Thin Film Phenomena," Chapter 2, McGraw-Hill Book Company, New York, 1969. The structure of FIG. 1b is then heated at 900° C. for six hours. During this heating procedure, Ti metal from layer 4 diffuses into the substrate 2 and, at the same time, Li$_2$O diffuses out from the surface of the substrate 2. Thus, the structure of FIG. 1c results, in which the substrate 2 contains a layer 6 in which Ti in-diffusion has occurred, with layer 4 becoming embedded in layer 6, and in which Li$_2$O out-diffusion has occurred, and a layer 8 in which further Li$_2$O out-diffusion has occurred. It is the out-diffusion of Li$_2$O from layers 6 and 8 which creates the difficulties in prior art structures as previously discussed.

In FIG. 2, there is shown a flowchart for some of the major steps in the process sequence for three embodiments of the invention. The first step, which is common to all three embodiments, is to provide a sample of LiNbO$_3$ or LiTaO$_3$ crystals. For example, in the case of LiNbO$_3$, a Y-cut crystal is provided in the form of a wafer one inch by one inch. Next, following branch I shown in FIG. 2, in the practice of one process embodiment of the invention, the sample is packed in a high purity (99.99%) powder of LiNbO$_3$ or LiTaO$_3$ and then annealed at 930° C. for 15 to 20 hours in flowing oxygen atmosphere. The waveguide structure thus produced by Li$_2$O in-diffusion guides most of the laser light in a surface layer of the wafer that is about 15 microns in depth. In addition, both the TE and TM polarizations of this waveguide are optimized for C-axis propagation.

Turning now to branch II shown in FIG. 2, to demonstrate two additional process embodiments of the invention, the sample of LiNbO$_3$ or LiTaO$_3$ is subjected to in-diffusion of ions of a transition metal, such as titanium, vanadium, or nickel. This is accomplished, for example, by electron-beam evaporating a layer of Ti, 200 angstroms thick onto the surface of the LiNbO$_3$ sample and diffusing Ti ions therefrom into the underlying substrate by heating the Ti coated substrate at 900° C. for six hours. Then, following branch IIA shown in FIG. 2, the sample is placed in molten LiNO$_3$ and annealed at 250° C. for 24 hours. As a result of the Li$_2$O compensation the prism coupling of the He-Ne laser light into the Li$_2$O out-diffused region is reduced by more than 10 times.

Turning now to branch IIB, to demonstrate a third process embodiment, after the sample of LiNbO$_3$ or LiTaO$_3$ has been in-diffused with Ti as indicated above, the sample is packed in a high purity powder of LiNbO$_3$ and annealed at 900° C. in a flowing oxygen atmosphere from 1 to 4 hours. The resulting waveguide structure showed complete suppression of waveguide modes due to Li$_2$O out-diffusion, while the single mode of the Ti in-diffusion waveguide was unaffected. Further details of this embodiment are described in Example 3 herein, as well as in an article entitled "Elimination of Li$_2$O Out-Diffusion Waveguide in LiNbO$_3$ and LiTaO$_3$", Bor-Uei Chen and Antonio C. Pastor, in *Applied Physics Letters*, Vol. 30, No. 11 (1 June 1977), pp. 570-571. It has further been discovered that this encapsulation treatment of the sample with LiNbO$_3$ powder can be carried out either before or simultaneously with the metal in-diffusion process, as well as subsequent to metal in-diffusion as shown in FIG. 2, branch IIB. In each alternative process embodiment, suppression of the out-diffusion waveguide is achieved.

In addition, it has been found that the extent to which the out-diffusion waveguide modes are suppressed is related to the length of the annealing time and the annealing temperature. Eighty percent of the Li$_2$O in-diffusion process, as indicated by changes in refractive index, occurred within less than 30 minutes of annealing and the asymptotic value of the change in the refractive index was approached after 2.5 hours. The fast reaction rate indicates that the LiNbO$_3$ powder treatment is effected both by the diffusion process and by solid-solid surface interaction. This conclusion is further supported by the fact that the desired change in the refractive index was substantially reduced when the sample was wrapped in platinum foil during annealing in the LiNbO$_3$ powder, in order to avoid physical contact with the LiNbO$_3$ powder.

The details of each process are more completely described in the following examples, which are presented in order for branch I, branches II and IIA combined, and branches II and IIB combined, of FIG. 2.

EXAMPLE 1

This example illustrates the process for forming a thin film waveguide in LiNbO$_3$ crystals in which both TE and TM polarizations are optimized by suppression of Li$_2$O out-diffusion and promotion of Li$_2$O in-diffusion into the crystal. This example presents more details of the process defined in FIG. 2, branch I.

A Y-cut LiNbO$_3$ crystal was provided as the substrate starting material. Then, the sample was completely surrounded by a high purity powder of LiNbO$_3$ contained in a crucible made of an inert material such as platinum and annealed at 930° C. for 15 to 20 hours. Using end-firing equipment as described by E. Garmire, H. Stoll, and A. Yariv, "Optical Waveguiding in Proton-Implanted GaAs," in *Applied Physics Letters*, Vol. 21, No. 3, Aug. 1, 1972, the results indicated that the incident laser light was guided in a surface layer of the substrate which extended to a depth of about 15 microns. The surface waveguide can support both TE and TM polarization waves propagating in the crystalline C-axis.

EXAMPLE 2

This example illustrates one process embodiment for forming an optical waveguide in LiNbO$_3$ crystals in which undesirable waveguide modes associated with Li$_2$O out-diffusion from the crystal are removed. This example presents more detail of the process defined in FIG. 2, branches II and IIA.

A Y-cut LiNbO$_3$ crystal was provided as the substrate starting material. Then, Ti metal was evaporated onto the surface of the substrate by well-known electron-beam sputtering techniques, to a thickness of 200 Å and this composite structure was heated at an elevated temperature of 900° C. for six hours, thereby producing Ti in-diffusion into the crystal. The resulting waveguide structure showed a single waveguide mode due to the Ti in-diffusion and four closely spaced waveguide modes due to Li$_2$O out-diffusion. The excitation and monitoring of waveguide modes was carried out using two prism couplers in the manner described by P. K. Tien, R. Ulrich, and R. J. Martin, "Modes of Propagating Light Waves in Thin-Deposited Semiconductor Films," in *Applied Physics Letters*, Vol. 14, p. 291 (1969). The intensity of the out-diffusion modes (under optimized coupling conditions) was equal to that of the in-diffused modes prior to treatment. The sample was then placed in molten LiNO$_3$ in a high-temperature furnace at 250° C. for 24 hours and the mode structure restudied. Subsequent to the treatment, the waveguide modes due to out-diffusion persisted but their intensity was reduced by more than 10 times their original value. This indicates that the excitation of these modes was reduced by the compensation for the loss of Li$_2$O by the LiNO$_3$ treatment.

EXAMPLE 3

This example illustrates another process embodiment for forming an optical waveguide in LiNbO$_3$ crystals in which undesirable waveguide modes associated with Li$_2$O out-diffusion from the crystal are removed. This example presents more detail of the process defined in FIG. 2, branches II and IIB.

A Y-cut LiNbO$_3$ crystal was provided as the substrate starting material. Then Ti metal was evaporated onto the surface of the substrate by well-known electron-beam sputtering techniques, to a thickness of 200 Å and diffused therein at 900° C. for six hours. The diffusion was carried out in a high-temperature furnace in a flowing oxygen atmosphere, using a thermocouple to monitor the temperature. The resulting waveguide structure showed a single waveguide mode due to Ti in-diffusion and two closely spaced waveguide modes due to Li$_2$O out-diffusion for TE polarization light propagating along the direction of the X-axis. The excitation and monitoring of waveguide modes was carried out using both prism couplers as described by P. K. Tien, R. Ulrich, R. J. Martin, in *Applied Physics Letters*, Vol. 14, p. 291 (1969) and end-firing equipment as described by E. Garmire, H. Stoll, and A. Yariv, "Optical Waveguiding in Proton-Implanted GaAs," in *Applied Physics Letters*, Vol. 21, No. 3, Aug. 1, 1972. The measurement of the optical intensity profile at the waveguide exit end indicated waveguide diffusion depths of ~4 μm for the Ti in-diffusion guide and ~15 μm for the $Li_2O$ out-diffusion guide. The sample was then packed in high-purity $LiNbO_3$ powder and fired at 900° C. in an oxygen atmosphere for four hours. After this powder treatment, waveguide modes due to $Li_2O$ out-diffusion were completely suppressed, while the single mode of Ti in-diffusion waveguide was not affected. No substrate coloration or surface deterioration was evident. The minimum back-diffusion time for complete suppression of $Li_2O$ out-diffusion modes was about 1 hour at 900° C. when fresh $LiNbO_3$ powder was used. The $LiNbO_3$ powder was prepared by heating at 900° C. a stoichiometric mixture of high-purity $Li_2CO_3$ (99.99%) and optical-grade $Nb_2O_5$, consisting of 79% by weight of $Nb_2O_5$ and 21% by weight of $Li_2CO_3$. During the heating process, the weight of the mixture was continuously monitored to ensure a complete reaction as evidenced by the weight loss due to the release of $CO_2$ gas.

In the process described in Example 3 above, the sample was treated with $LiNbO_3$ powder after the Ti had been diffused into the $LiNbO_3$ substrate. The $LiNbO_3$ powder treatment may optionally be performed either before or simultaneously with the Ti in-diffusion process. In the former case, the $LiNbO_3$ wafer was pretreated with $LiNbO_3$ powder at 900° C. for 16 hours, and no out-diffusion waveguide mode was observed after a subsequent Ti metal in-diffusion process. In the latter case, the Ti oxidation and in-diffusion processes were performed with the $LiNbO_3$ substrated packed in $LiNbO_3$ powder; again the $Li_2O$ out-diffusion process was suppressed.

In addition, the $LiNbO_3$ powder treatment described in Example 3 above has been performed on Ti in-diffused $LiTaO_3$ waveguides and the same results were obtained as for the $LiNbO_3$ waveguides described herein.

While the invention has been particularly described with respect to the preferred embodiments thereof, it will be recognized by those skilled in the art that certain modifications in form and detail may be made without departing from the spirit and scope of the invention. In particular, the scope of the invention is intended to include any combination of $LiNbO_3$ crystals and $LiTaO_3$ crystals with $LiNbO_3$, $LiTaO_3$, and $LiNO_3$ materials under conditions which will provide the $Li_2O$-rich environment at sufficient vapor pressure to allow the $Li_2O$ in-diffusion compensation process and the solid-solid surface interaction to occur.

What is claimed is:

1. A process for treating lithium niobate ($LiNbO_3$) and lithium tantalate ($LiTaO_3$) crystals which includes exposing a sample of either $LiNbO_3$ or $LiTaO_3$ to a material selected from the group of compounds consisting of $LiNbO_3$, $LiTaO_3$, and $LiNO_3$ and then annealing said sample for a period of time and at a predetermined elevated temperature sufficient to produce a uniform $Li_2O$ vapor pressure and a $Li_2O$-rich environment at the surface of said sample, whereby out-diffusion of $Li_2O$ molecules from said sample is suppressed.

2. A process as set forth in claim 1 wherein the exposure and annealing of said sample comprises encapsulating said sample in a high purity powder of a material selected from the group consisting of $LiNbO_3$ and $LiTaO_3$ and then annealing said sample at 900° C. in a flowing oxygen environment for approximately one hour, whereby undesirable waveguide modes in said sample which are associated with $Li_2O$ out-diffusion therefrom, are removed.

3. A process as set forth in claim 1 wherein the exposure and annealing of said sample comprises encapsulating said sample in a high purity powder of a material selected from the group consisting of $LiNbO_3$ and $LiTaO_3$ and then annealing said sample at 930° C. in a flowing oxygen environment for a period of time between 15 and 20 hours whereby $Li_2O$ out-diffusion from said sample is suppressed and $Li_2O$ in-diffusion is promoted, to form a thin-film waveguide in which both TE and TM polarizations are optimized.

4. A process as set forth in claim 1 wherein the exposure and annealing of said sample comprises surrounding said sample with molten $LiNO_3$ and then annealing said sample at 250° C. in a flowing oxygen environment for 24 hours, whereby undesirable waveguide modes in said sample which are associated with $Li_2O$ out-diffusion therefrom, are suppressed.

5. A method for forming an optical waveguide in $LiNbO_3$ and $LiTaO_3$ crystals in which undesirable waveguide modes associated with $Li_2O$ out-diffusion from said crystals are removed by elimination of $Li_2O$ out-diffusion from said crystals, which includes encapsulating a crystal of either $LiNbO_3$ or $LiTaO_3$ in a high purity powder of a material selected from the group consisting of $LiNbO_3$ and $LiTaO_3$ and then annealing said crystal at 900° C. in a flowing oxygen environment for approximately one hour.

6. A method for forming an optical waveguide in $LiNbO_3$ and $LiTaO_3$ crystals in which undesirable waveguide modes associated with $Li_2O$ out-diffusion from said crystals are minimized by suppression of $Li_2O$ out-diffusion from said crystals, which includes surrounding said crystal with molten $LiNO_3$ and then annealing said crystal at 250° C. in a flowing oxygen environment for 24 hours.

7. A method for forming a thin-film waveguide in $LiNbO_3$ and $LiTaO_3$ crystals in which both TE and TM polarizations are optimized for C-axis propagation by elimination of $Li_2O$ out-diffusion from said crystals and promotion of $Li_2O$ in-diffusion into said crystals, which includes encapsulating a sample of either $LiNbO_3$ or $LiTaO_3$ in a high purity powder of a material selected from the group consisting of $LiNbO_3$ and $LiTaO_3$ and then annealing said sample at 930° C. in a flowing oxygen environment for a period of time between 15 and 20 hours.

8. An optical waveguide structure in $LiNbO_3$ and $LiTaO_3$ crystals in which $Li_2O$ out-diffusion from said crystals is suppressed, formed by:
   (a) providing a sample of a material selected from the group consisting of $LiNbO_3$ and $LiTaO_3$ crystals,
   (b) exposing said sample to a material selected from the group of compounds consisting of $LiNbO_3$, $LiTaO_3$ and $LiNO_3$, and
   (c) annealing said sample for a period of time and at a predetermined elevated temperature sufficient to produce a uniform $Li_2O$ vapor pressure and a $Li_2O$-rich environment at the surface of said sample.

9. An optical waveguide structure in $LiNbO_3$ and $LiTaO_3$ crystals in which undesirable waveguide modes associated with $Li_2O$ out-diffusion from said crystals are removed, formed by:
   (a) providing a sample of a material selected from the group consisting of $LiNbO_3$ and $LiTaO_3$ crystals,
   (b) in-diffusing chosen transition metal ions into said sample, (c) encapsulating the metal-diffused sample in a high purity powder of a material selected from the group consisting of LiNbO$_3$ and LiTaO$_3$, and (d) annealing said sample at 900° C. in a flowing oxygen environment for approximately one hour.

10. An optical waveguide structure in LiNbO$_3$ and LiTaO$_3$ crystals in which undesirable waveguide modes associated with Li$_2$O out-diffusion from said crystals are suppressed, formed by:

(a) providing a sample of a material selected from the group consisting of LiNbO$_3$ and LiTaO$_3$ crystals, (b) in-diffusing transition metal ions into said sample, (c) surrounding said metal-diffused sample with molten LiNO$_3$, and (d) annealing said sample at 250° C. in a flowing oxygen environment for 24 hours.

11. A thin-film waveguide structure in LiNbO$_3$ and LiTaO$_3$ crystals in which both TE and TM polarizations are optimized for C-axis propagation by elimination of Li$_2$O out-diffusion from said crystals, formed by:

(a) providing a sample of a material selected from the group consisting of LiNbO$_3$ and LiTaO$_3$ crystals, (b) encapsulating said sample in a high purity powder of a material selected from LiNbO$_3$ and LiTaO$_3$, and (c) annealing said sample at 930° C. in a flowing oxygen environment for a period of time between 15 and 20 hours.

* * * * *